(12) United States Patent
Kim et al.

(10) Patent No.: US 12,185,450 B2
(45) Date of Patent: Dec. 31, 2024

(54) SEMICONDUCTOR MANUFACTURING APPARATUS AND OPERATING METHOD THEREOF

(71) Applicant: Samsung Electronics Co., Ltd., Suwon-si (KR)

(72) Inventors: Dohyung Kim, Hwaseong-si (KR); Seongchul Hong, Suwon-si (KR); Insung Kim, Seongnam-si (KR); Jinhong Park, Yongin-si (KR); Jungchul Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/628,152

(22) Filed: Apr. 5, 2024

(65) Prior Publication Data

US 2024/0251496 A1  Jul. 25, 2024

Related U.S. Application Data

(62) Division of application No. 17/163,945, filed on Feb. 1, 2021, now Pat. No. 11,979,973.

(30) Foreign Application Priority Data

Jun. 9, 2020 (KR) .................. 10-2020-0069511

(51) Int. Cl.
*H05G 2/00* (2006.01)
*G03F 7/00* (2006.01)
*H01L 21/268* (2006.01)

(52) U.S. Cl.
CPC .......... *H05G 2/008* (2013.01); *H01L 21/268* (2013.01); *G03F 7/70033* (2013.01)

(58) Field of Classification Search
CPC ............ G02B 19/0047; G02B 26/0875; G02B 26/0816; G02B 19/0095; G02B 19/0019; H01S 3/0071; H01L 21/027
See application file for complete search history.

(56) References Cited

U.S. PATENT DOCUMENTS 8,461,560 B2   6/2013  Ershov et al.
8,704,200 B2   4/2014  Bykanov et al.
(Continued)

FOREIGN PATENT DOCUMENTS

EP    3248442 B1    1/2019
JP    2012134447 A  7/2012
(Continued)

*Primary Examiner* — Edward Chin
(74) *Attorney, Agent, or Firm* — Myers Bigel, P.A.

(57) ABSTRACT

Disclosed are semiconductor manufacturing apparatuses and operating methods thereof. The semiconductor manufacturing apparatus includes an oscillation unit that includes a first seed laser, a second seed laser, and a seed module, wherein the first seed laser oscillates a first pulse, and wherein the second seed laser oscillates a second pulse, and an extreme ultraviolet generation unit configured to use the first and second pulses to generate extreme ultraviolet light. The seed module includes a plurality of mirrors configured to allow the first and second pulses to travel along first and second paths, respectively, and a pulse control optical system including a first optical element, a second optical element, and a third optical element. The pulse control optical system is on the second path that does not overlap the first path. The third optical element includes a lens between the first optical element and the second optical element.

12 Claims, 9 Drawing Sheets

(56) References Cited

U.S. PATENT DOCUMENTS

| | | |
|---|---|---|
| 9,129,717 B2 | 9/2015 | Lambert et al. |
| 9,239,268 B1 | 1/2016 | Liu et al. |
| 9,832,852 B1 | 11/2017 | Fomenkov et al. |
| 10,327,318 B2 | 6/2019 | Lambert et al. |
| 10,667,377 B2 | 5/2020 | Rafac et al. |
| 2013/0077073 A1 | 3/2013 | Van et al. |
| 2014/0264091 A1 | 9/2014 | Fleurov et al. |
| 2015/0334813 A1 | 11/2015 | Van Schoot et al. |
| 2018/0031979 A1 | 2/2018 | Bleeker et al. |
| 2018/0317308 A1* | 11/2018 | Chang .................. H05G 2/005 |
| 2019/0186892 A1* | 6/2019 | Odle ...................... G01P 13/00 |
| 2019/0239329 A1 | 8/2019 | Yanagida |
| 2021/0036101 A1* | 2/2021 | Choi ...................... H01L 28/56 |
| 2022/0206397 A1 | 6/2022 | Beerens et al. |

FOREIGN PATENT DOCUMENTS

| | | | |
|---|---|---|---|
| JP | 2021516775 A * | 7/2021 | |
| KR | 20150130440 A | 11/2015 | |
| TW | 201922060 A | 6/2019 | |
| TW | 202105069 A | 2/2021 | |
| WO | WO-2020081734 A1 * | 4/2020 | .......... G02F 1/0327 |

\* cited by examiner

SEMICONDUCTOR MANUFACTURING APPARATUS AND OPERATING METHOD THEREOF

CROSS-REFERENCE TO RELATED APPLICATION

This application is a divisional of U.S. patent application Ser. No. 17/163,945, filed Feb. 1, 2021, which application claims priority under 35 U.S.C § 119 to Korean Patent Application No. 10-2020-0069511 filed on Jun. 9, 2020 in the Korean Intellectual Property Office, the disclosures of which are hereby incorporated by reference in their entireties.

BACKGROUND

The present inventive concepts relate to a semiconductor manufacturing apparatus and an operating method thereof, and more particularly, to an extreme ultraviolet light source and an operating method thereof.

Lithography using an extreme ultraviolet (EUV) light source is expected for micro-fabrication of next-generation semiconductors. Lithography is a technique in which a silicon substrate receives a reduced beam or light projected thereto through a mask on which circuit patterns are drawn to form electronic circuits on the silicon substrate, and extreme ultraviolet light means a ray whose wavelength ranges from about 1 nm to about 100 nm. Because circuits formed by optical lithography have their minimum processing dimension that basically depends on the wavelength of a light source, it is essential to reduce the wavelength of the light source for the development of next-generation semiconductors, and thus research is actively conducted on the advancement of EUV light sources.

SUMMARY

Some example embodiments of the present inventive concepts provide a semiconductor manufacturing apparatus and an operating method thereof, which apparatus has improved stability and increased productivity.

Objects of the present inventive concepts are not limited to that mentioned above, and other objects which have not been mentioned above will be understood to those skilled in the art from the following description.

According to some example embodiments of the present inventive concepts, a semiconductor manufacturing apparatus may include: an oscillation unit including a first seed laser, a second seed laser, and a seed module, wherein the first seed laser is configured to oscillate a first pulse, and wherein the second seed laser is configured to oscillate a second pulse; and an extreme ultraviolet generation unit configured to use the first and second pulses to generate extreme ultraviolet light. The seed module may include: a plurality of mirrors configured to allow the first and second pulses to travel along first and second paths, respectively; and a pulse control optical system including a first optical element, a second optical element, and a third optical element. The pulse control optical system may be provided on the second path that does not overlap the first path. The third optical element may include a lens between the first optical element and the second optical element.

According to some example embodiments of the present inventive concepts, a semiconductor manufacturing apparatus may include: an oscillation unit that includes a first seed laser, a second seed laser, and a seed module, wherein the first seed laser is configured to oscillate a first pulse, and wherein the second seed laser is configured to oscillate a second pulse; an extreme ultraviolet generation unit including a target generator and a focusing mirror, wherein the extreme ultraviolet generation unit is configured to generate extreme ultraviolet light by allowing the first and second pulses to collide with corresponding targets produced from the target generator; an amplification unit between the oscillation unit and the extreme ultraviolet generation unit, wherein the amplification unit includes a plurality of amplifiers; a transport unit configured to allow the first and second pulses to travel from the amplification unit to the extreme ultraviolet generation unit; and an exposure unit configured to provide a wafer with the extreme ultraviolet light generated from the extreme ultraviolet generation unit. The seed module may include: a plurality of mirrors configured to allow the first and second pulses to travel along first and second paths, respectively; a pulse control optical system including a first optical element, a second optical element, and a third optical element; and at least one camera configured to monitor the first pulse or the second pulse. The pulse control optical system may be provided on the second path that does not overlap the first path. The third optical element may include a lens between the first optical element and the second optical element.

According to some example embodiments of the present inventive concepts, an operating method of a semiconductor manufacturing apparatus may include: oscillating a first pulse and a second pulse from an oscillation unit that includes a first seed laser, a second seed laser, and a seed module; controlling the second pulse on a path of the second pulse in the seed module, wherein the path of the second pulse does not overlap a path of the first pulse; amplifying the first and second pulses through a plurality of amplifiers; and colliding the first and second pulses with corresponding targets to generate extreme ultraviolet light. The step of controlling the second pulse may be performed in a pulse control optical system including a lens.

DETAILED DESCRIPTION OF EMBODIMENTS

The following will now describe a semiconductor manufacturing apparatus and an operating method thereof according to some example embodiments of the present inventive concepts in conjunction with the accompanying drawings.

Figure 1:
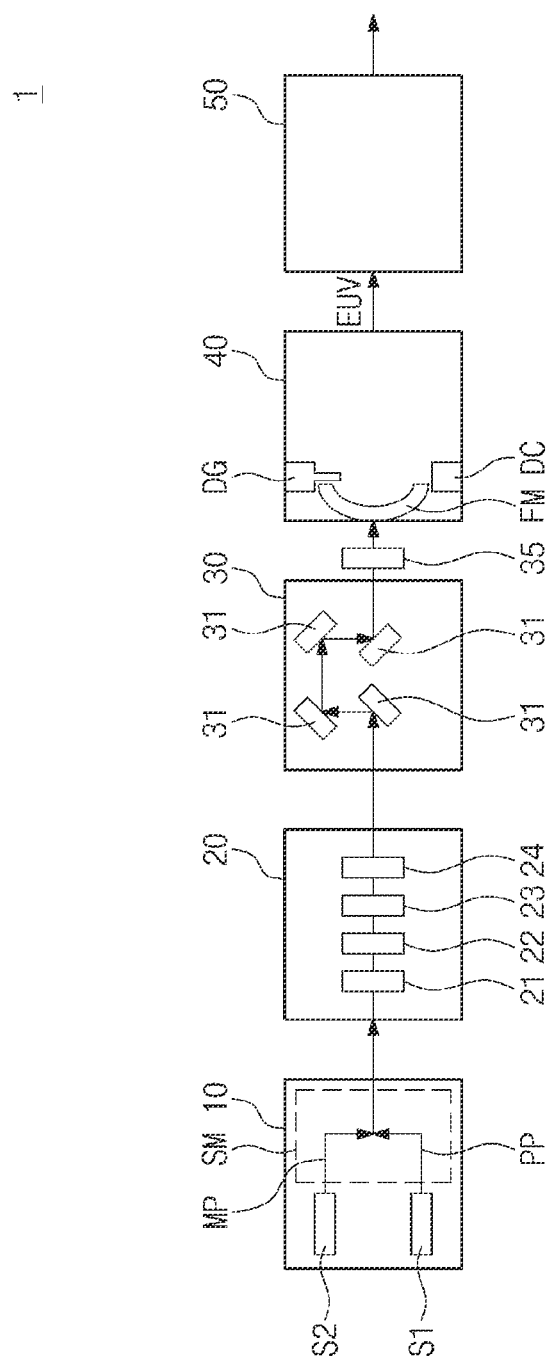
FIG. 1 illustrates a conceptual block diagram showing a semiconductor manufacturing apparatus and an operating method thereof according to some example embodiments of the present inventive concepts.

FIG. 1 illustrates a conceptual block diagram showing a semiconductor manufacturing apparatus and an operating method thereof according to some example embodiments of the present inventive concepts.

Referring to FIG. 1, a semiconductor manufacturing apparatus according to the present inventive concepts may be or include an extreme ultraviolet light source 1. The extreme ultraviolet light source 1 may include an oscillation unit or oscillation system 10, an amplification unit or amplification system 20, a transport unit or transport system 30, an extreme ultraviolet generation unit or extreme ultraviolet generation system 40, and an exposure unit or exposure system 50. The extreme ultraviolet light source 1 according to the present inventive concepts may be, for example, a laser-produced plasma (LPP) light source.

The oscillation unit 10 may include a first seed laser S1 that oscillates a first pulse PP, a second seed laser S2 that oscillates a second pulse MP, and a seed module SM. The seed module SM may be provided between the amplification unit 20 and the first and second seed lasers S1 and S2. For example, each of the first and second seed lasers S1 and S2 may be an excimer laser, a solid state laser, or a $CO_2$ laser. The first pulse PP may be a pre-pulse, and the second pulse MP may be a main pulse. The first pulse PP and the second pulse MP may have different wavelengths from each other. For example, the first pulse PP may have a wavelength shorter than that of the second pulse MP, and may also have resolution higher than that of the second pulse MP.

Figure 3:
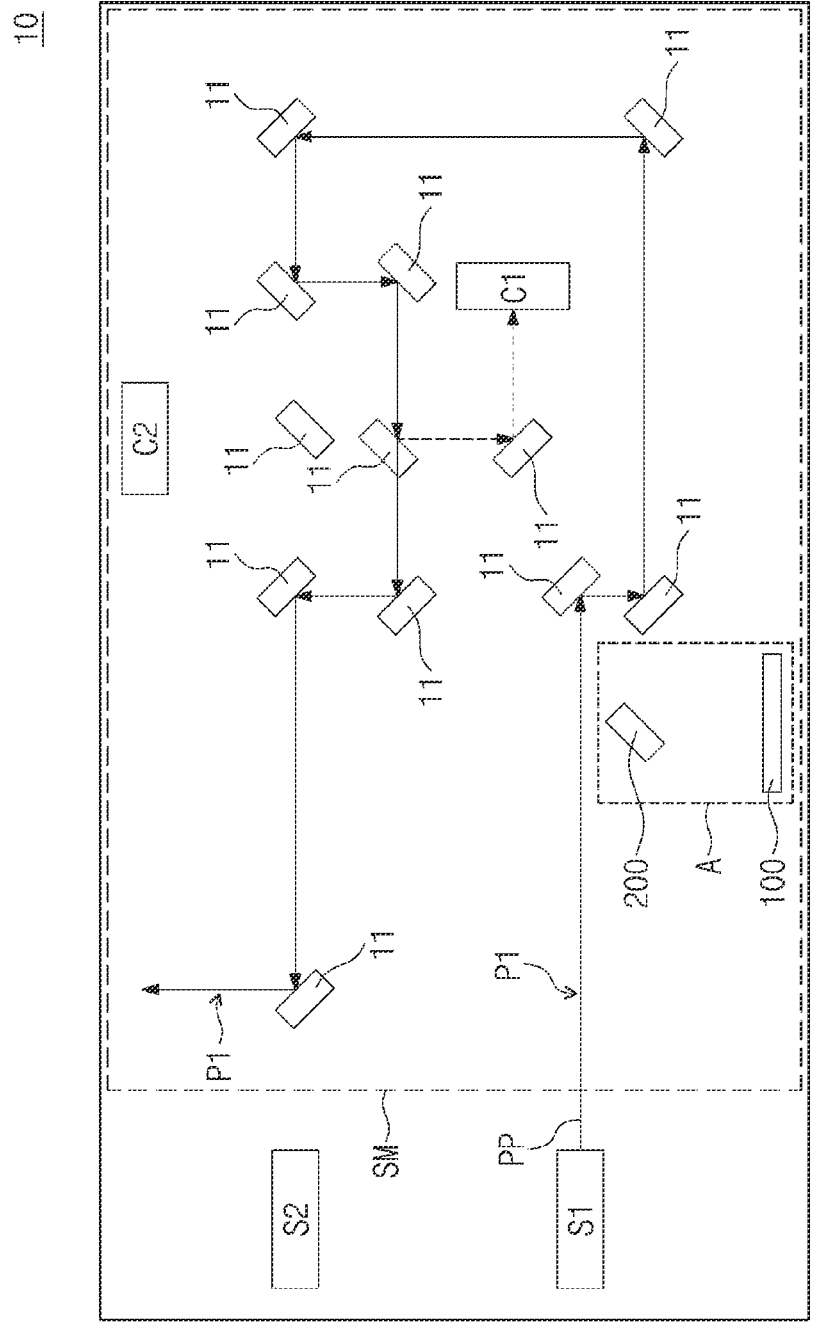
FIGS. 3 to 5 illustrate conceptual schematic diagrams showing paths of pulses in an oscillation unit of a semiconductor manufacturing apparatus according to some example embodiments of the present inventive concepts.
Figure 4:
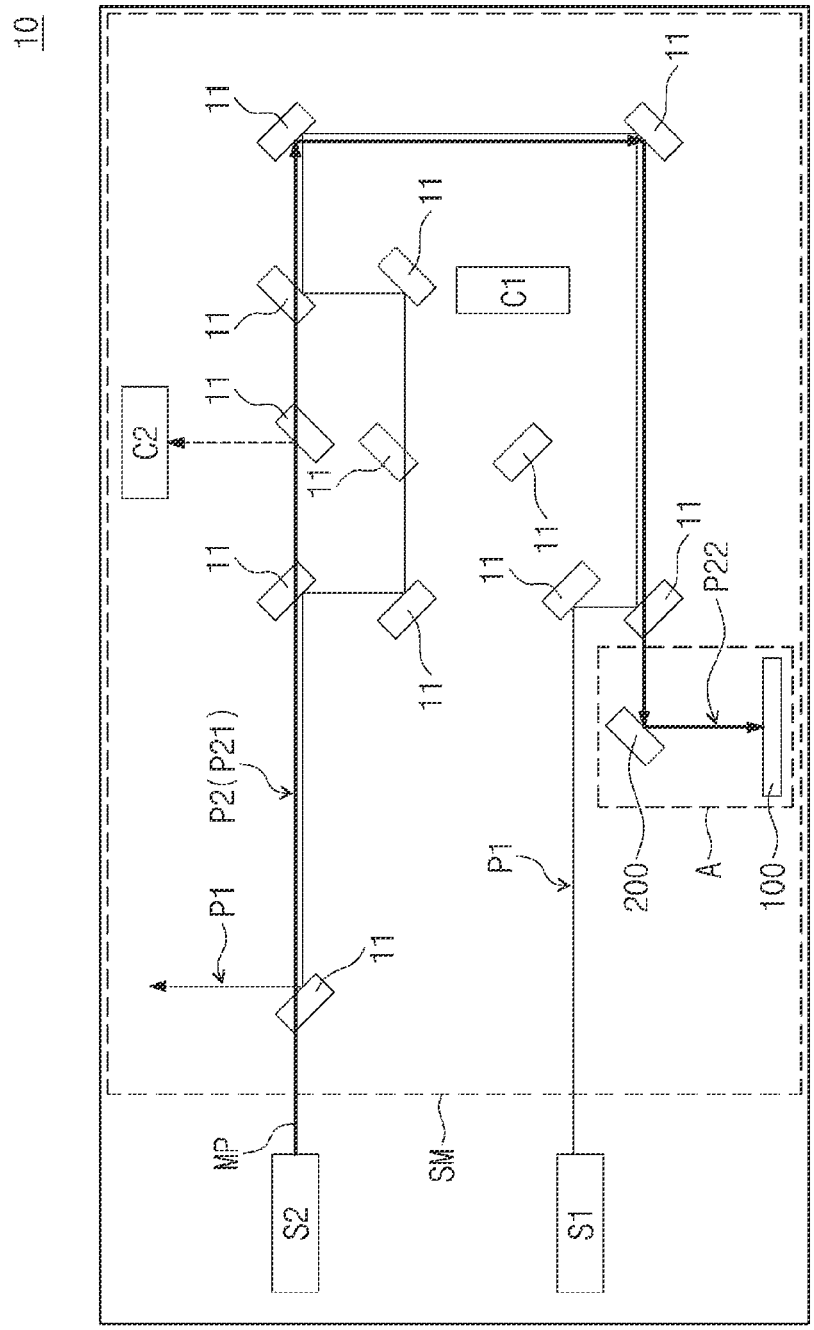
Figure 5:
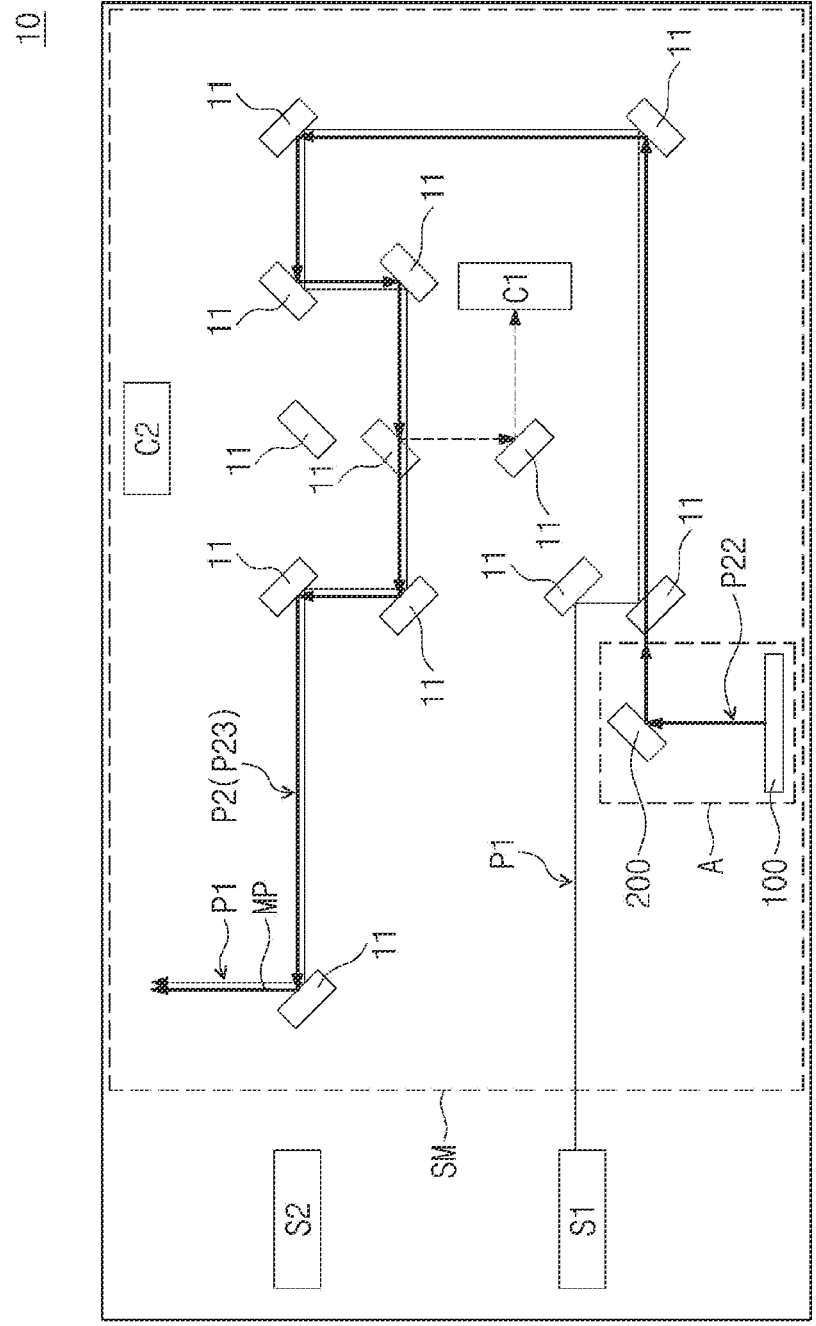

The seed module SM may include a plurality of mirrors (see 11 of FIGS. 3 to 5), a pulse control optical system (see A of FIGS. 3 to 5), and one or more cameras (see C1 and C2 of FIGS. 3 to 5). With reference to FIGS. 3 to 5, the following will describe a detailed configuration of the oscillation unit 10 that includes the seed module SM and the first and second seed lasers S1 and S2.

The first and second pulses PP and MP respectively oscillated from the first and second seed lasers S1 and S2 of the oscillation unit 10 may pass through the amplification unit 20 and the transport unit 30. For example, the first and second pulses PP and MP output from the oscillation unit 10 may travel along substantially the same path or in parallel with an offset from each other. In other words, the pulses PP and MP output from the oscillation unit 10 may travel along substantially the same path or may be parallel and spaced apart from one another.

The amplification unit 20 may be provided between the oscillation unit 10 and the extreme ultraviolet generation unit 40. The amplification unit 20 may include at least one amplifier such as a power amplifier. For example, the amplification unit 20 may include first, second, third, and fourth amplifiers 21, 22, 23, and 24, but no limitation is imposed on the number of power amplifiers. The first to fourth amplifiers 21 to 24, which are sequentially provided, may be called a high power amplification chain (HPAC). Differently from that shown, the amplification unit 20 may further include a pre-amplifier between the first amplifier 21 and the seed module SM of the oscillation unit 10. The oscillation unit 10 that oscillates the first and second pulses PP and MP and the amplification unit 20 that amplifies the first and second pulses PP and MP may be called a master oscillator power amplifier (MOPA).

The transport unit 30 may be provided between the amplification unit 20 and the extreme ultraviolet generation unit 40. The transport unit 30 may allow the first and second pulses PP and MP to travel from the amplification unit 20 to the extreme ultraviolet generation unit 40, and may concurrently control the first and second pulses PP and MP. For example, the transport unit 30 may be configured to control positions and/or angles of the first and second pulses PP and MP with a plurality of mirrors 31. The extreme ultraviolet generation unit 40 may receive the first and second pulses PP and MP that have passed through the transport unit 30.

A pulse controller 35 may be provided between the transport unit 30 and the extreme ultraviolet generation unit 40. The pulse controller 35 may control the first pulse PP. When the first and second pulses PP and MP travel toward the extreme ultraviolet generation unit 40, the pulse controller 35 may make a biased angle (see BA of FIG. 2) between the first and second pulses PP and MP that propagate along substantially the same path at the amplification unit 20 and the transport unit 30.

The extreme ultraviolet generation unit 40 may be configured such that the first and second pulses PP and MP that have passed through the transport unit 30 are used to generate extreme ultraviolet light EUV. The extreme ultraviolet light EUV may be a ray with a wavelength range of about 1 nm to about 100 nm, for example, of about 13.5 nm. The exposure unit 50 may receive the extreme ultraviolet light EUV produced from the extreme ultraviolet generation unit 40. The exposure unit 50 may be configured such that a wafer W receives the extreme ultraviolet light EUV that is reduced and projected thereto. The extreme ultraviolet generation unit 40 and the exposure unit 50 will be further described in detail below with reference to FIG. 2.

Figure 2:
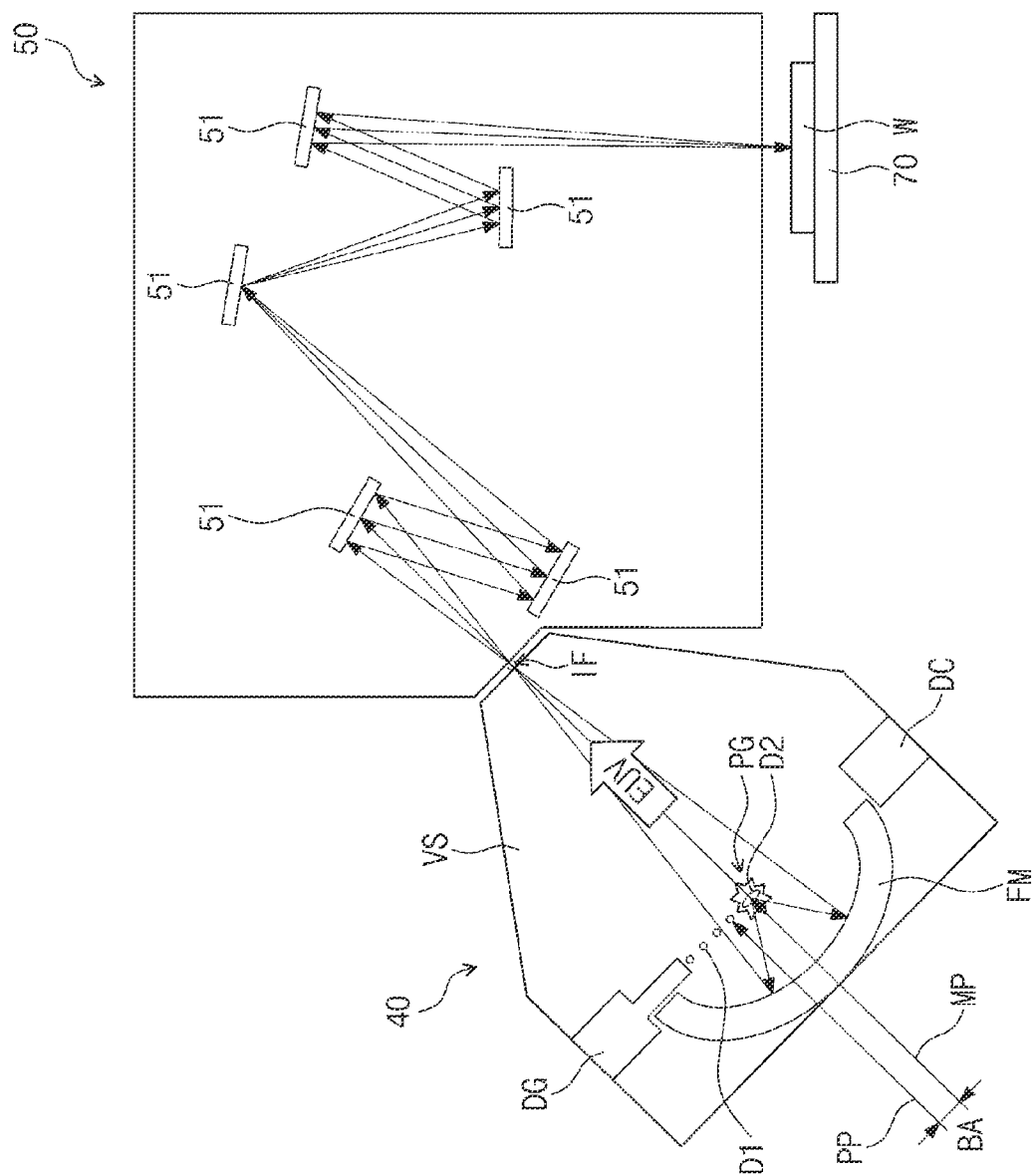
FIG. 2 illustrates an enlarged schematic diagram showing an extreme ultraviolet generation unit and an exposure unit of a semiconductor manufacturing apparatus according to some example embodiments of the present inventive concepts.

FIG. 2 illustrates an enlarged schematic diagram showing an extreme ultraviolet generation unit and an exposure unit of a semiconductor manufacturing apparatus according to some example embodiments of the present inventive concepts.

Referring to FIG. 2, the extreme ultraviolet generation unit 40 may include a target generator DG, a target collector DC, a focusing mirror FM, and a housing VS that envelops the target generator DG, the target collector DC, and the focusing mirror FM. The housing VS may be a hermetic vacuum chamber.

The target generator DG may produce targets at a regular period. The targets may include a material that emits the extreme ultraviolet light EUV when converted into plasma PG. For example, the targets may include tin (Sn), lithium (Li), or xenon (Xe). When tin (Sn) is adopted, the targets may include one of pure tin (Sn), tin compounds (e.g., $SnBr_4$, $SnBr_2$, or $SnH_4$), and tin alloys (e.g., tin-gallium alloy, tin-indium alloy, or tin-indium-gallium alloy). The targets may be shaped like, for example, droplets, streams, or clusters.

The first and second pulses PP and MP may be irradiated on the targets that migrate from the target generator DG toward the target collector DC. The pulse controller (see 35 of FIG. 1) may allow the first and second pulses PP and MP to form a biased angle BA, and the first and second pulses PP and MP may be irradiated on different targets from each other.

The first pulse PP may be irradiated on a first target D1, and thus the first target D1 may change its shape. A second target D2 may have its width and cross-sectional area greater than those of the first target D1. For example, the first target D1 may have a width of equal to or less than about 40 μm, and the second target D2 may have a width of equal to or greater than about 40 μm. Afterwards, the second pulse MP may be irradiated on the second target D2, generating the plasma PG. The extreme ultraviolet light EUV may be emitted from the second target D2 that has been converted into the plasma PG.

Although the extreme ultraviolet light EUV is emitted in all directions from the plasma PG, the focusing mirror FM may force the extreme ultraviolet light EUV to concentrate on an intermediate focus IF. After that, the extreme ultraviolet light EUV may be reflected from a plurality of mirrors 51 provided in the exposure unit 50, thereby being projected onto the wafer W. The wafer W may be provided on a wafer support 70.

FIGS. 3 to 5 illustrate conceptual schematic diagrams showing paths of pulses in an oscillation unit of a semiconductor manufacturing apparatus according to some example embodiments of the present inventive concepts. FIG. 3 shows a path of a first pulse in an oscillation unit, and FIGS. 4 and 5 show a path of a second pulse in an oscillation unit.

Referring to FIGS. 3, 4, and 5, the seed module SM of the oscillation unit 10 may include a plurality of mirrors 11 configured to allow the first and second pulses PP and MP to travel along first and second paths P1 and P2, a pulse control optical system A provided on a portion of the second path P2, and first and second cameras C1 and C2 that monitor the first pulse PP or the second pulse MP. Although not shown, a plurality of optical devices may be provided between the seed module SM and the first and second seed lasers S1 and S2. The optical devices may be, for example, an optical coupler, an acousto-optic modulator (AOM), or an electro-optic modulator (EOM).

Each of the plurality of mirrors 11 may be one of a plain mirror, a dichroic mirror, and a beam splitter, each of which is disposed to have an angle of incidence (AOI) of about 45°. The present inventive concepts, however, are not limited thereto, and the plurality of mirrors 11 may have various shapes at different positions.

A portion of the first pulse PP that travels along the first path P1 may be reflected from one of the plurality of mirrors 11, and may then be input to the first camera C1. A portion of the second pulse MP that travels along the second path P2 may be reflected from one of the plurality of mirrors 11, and may then be input to the first camera C1 or the second camera C2. The first and second cameras C1 and C2 may monitor positions and/or angles of the first pulse PP or the second pulse MP. For example, the first and second cameras C1 and C2 may monitor to determine whether or not the first and second pulses PP and MP travel along substantially the same path or whether or not one pulse travels along a path relatively deviated from that of other pulse.

Referring to FIG. 3, the first pulse PP may be oscillated from the first seed laser S1. The first pulse PP may travel along the first path P1 in the seed module SM. The first path P1 may be determined by the plurality of mirrors 11 in the seed module SM. The first path P1 may not pass through the pulse control optical system A that includes a first optical element 100 and a second optical element 200.

Referring to FIGS. 4 and 5, the second pulse MP may be oscillated from the second seed laser S2. The second pulse MP may travel along the second path P2 in the seed module SM. The second path P2 may be determined by the plurality of mirrors 11 in the seed module SM.

The second path P2 may include a first sub-path P21 that extends from the second seed laser S1 to the pulse control optical system A, a second sub-path P22 in the pulse control optical system A, and a third sub-path P23 that extends from the pulse control optical system A until the second pulse MP is output from the seed module SM.

At least portions of the first and third sub-paths P21 and P23 may overlap the first path P1 of the first pulse PP. The first and third sub-paths P21 and P23 may be a common path along which the first and second pulses PP and MP travel. In contrast, the second sub-path P22 may not overlap the first path P1. The first pulse PP may not travel along the second sub-path P22. For this reason, the first and second pulses PP and MP may have therebetween no interference on the second sub-path P22.

Only the second pulse MP may be selectively controlled by the pulse control optical system A provided on the second sub-path P22. As the pulse control optical system A selectively controls the second pulse MP, it may be possible to correct a phenomenon that one pulse travels along a path relatively deviated from that of other pulse. The pulse correction mentioned above may cause the first and second pulses PP and MP to travel along substantially the same path or in parallel with an offset from each other when the first and second pulses PP and MP are output from the seed module SM, and the first and second pulses PP and MP may have improved stability in the amplification unit 20 and the transport unit 30. As the first and second pulses PP and MP have improved stability, the first and second pulses PP and MP may be exactly or more precisely irradiated on the targets in the extreme ultraviolet generation unit 40, and as a result, the semiconductor manufacturing apparatus according to the present inventive concepts may have increased productivity.

With reference to FIGS. 6 to 9, the following will describe a detailed configuration of the pulse control optical system A shown in FIGS. 3 to 5.

Figure 6:
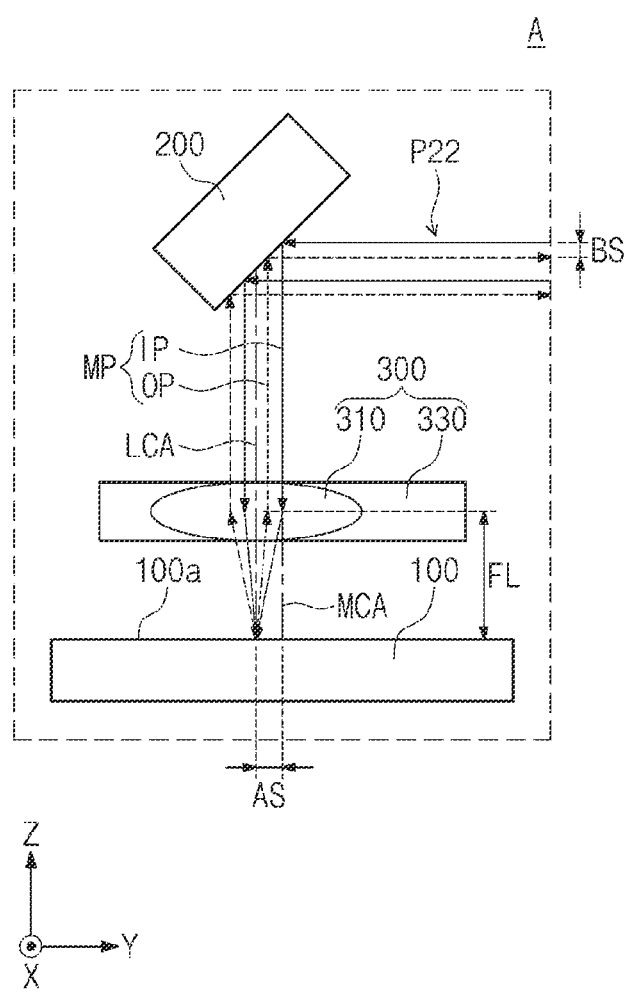
FIGS. 6 to 9 illustrate conceptual schematic diagrams corresponding to section A of FIGS. 3 to 5, respectively, partially showing an oscillation unit of a semiconductor manufacturing apparatus according to some example embodiments of the present inventive concepts.

FIG. 6 illustrates a conceptual schematic diagram showing a pulse control optical system in an oscillation unit of a semiconductor manufacturing apparatus according to some example embodiments of the present inventive concepts.

Referring to FIG. 6, the pulse control optical system A may include first, second, and third optical elements 100, 200, and 300. The first, second, and third optical elements 100, 200, and 300 may be configured to allow the pulse control optical system A to have therein the second sub-path P22 along which is propagated the second pulse MP that is explained as an input pulse IP and an output pulse OP. The first, second, and third optical elements 100, 200, and 300 may overlap vertically (e.g., in a Z-axis direction).

The input pulse IP may be reflected from the first optical element 100 and may then be changed into the output pulse OP. The first optical element 100 may have a first central axis MCA. The first optical element 100 may be a planar mirror, but the present inventive concepts are not limited thereto, and a top surface 100a of the first optical element 100 may have various shapes. For example, the first optical element 100 may include an actuator, which actuator may drive the first optical element 100 to move vertically (e.g., in the Z-axis direction).

The second optical element 200 may be a mirror substantially the same as one of the plurality of mirrors 11 in the seed module SM described with reference to FIGS. 3 to 5. The second optical element 200 may allow the first optical element 100 to receive the input pulse IP that is input to the pulse control optical system A. The second optical element 200 may cause the pulse control optical system A to output the output pulse OP reflected from the first optical element 100.

The third optical element 300 may include a lens 310 that is provided between the first and second optical elements 100 and 200, and may also include an actuator 330 that drives the lens 310.

Between the first and second optical elements 100 and 200, the lens 310 may be provided on paths along which are propagated by the input pulse IP and the output pulse OP. The lens 310 may have a focal length FL of, for example, several tens to several hundreds of millimeters (mm) The focal length FL of the lens 310 may be substantially the same as a spacing distance in the Z-axis direction between the lens 310 and the first optical element 100. The lens 310 may have a second central axis LCA. The second central axis LCA of the lens 310 may be spaced apart from the first central axis MCA of the first optical element 100.

The actuator 330 may contact at least a portion of the lens 310. The actuator 330 may control a position of the lens 310 with respect to the first optical element 100. For example, the actuator 330 may drive the lens 310 to move in any of positive and negative X-axis, Y-axis, and Z-axis directions. The actuator 330 may be or include a piezoelectric device or a step motor, but the present inventive concepts are not limited thereto.

As shown, the actuator 330 may drive the second central axis LCA of the lens 310 to move in the negative Y-axis direction from the first central axis MCA of the first optical element 100. The actuator 330 may induce a first shift AS between the first central axis MCA and the second central axis LCA. The first shift AS may range, for example, from about several tens of micrometers (μm) to about several millimeters (mm) This case, however, is merely exemplary, and the actuator 330 may drive the second central axis LCA of the lens 310 to move to a different amount or location as needed.

The movement of the lens 310 driven by the actuator 330 may induce a second shift BS between the input pulse IP and the output pulse OP. The second shift BS may be the degree of how much the output pulse OP is offset from the input pulse IP. For example, at a location where the second sub-path P22 begins and ends, the second shift BS may be defined to indicate a spacing distance in the Z-axis direction between a central axis of the input pulse IP and a central axis of the output pulse OP. The second shift BS may range, for example, from about several tens of micrometers (μm) to about several millimeters (mm) More narrowly, the second shift BS may range from about 10 μm to about 90 μm. In the oscillation unit 10, the second shift BS may control the second sub-path P22 of the second pulse MP. The seed module SM may output both the first pulse PP and the output pulse OP of the second pulse MP with the second shift BS.

Figure 7:
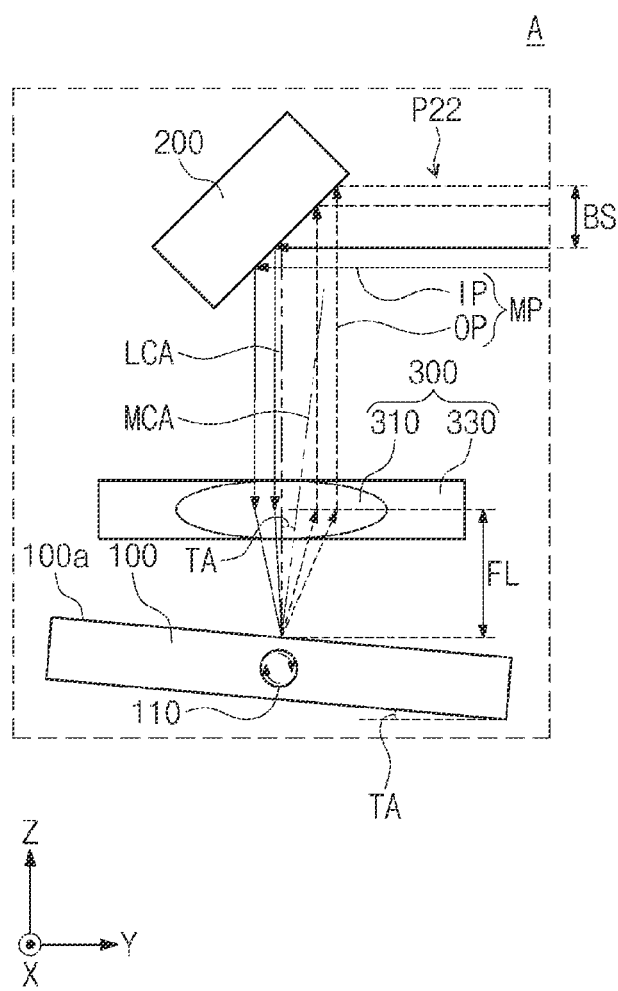

FIG. 7 illustrates a conceptual schematic diagram showing a pulse control optical system in an oscillation unit of a semiconductor manufacturing apparatus according to some example embodiments of the present inventive concepts. For convenience of description, omission may be made to avoid repetitive explanation of components the same or substantially the same as those described with reference to FIG. 6.

Referring to FIG. 7, the first optical element 100 may include a rotator 110. The rotator 110 may be provided at a central portion of the first optical element 100. For example, the rotator 110 may drive the first optical element 100 to rotate at an angle in a clockwise direction (or counterclockwise direction) on or relative to a plane formed by the Y-axis and Z-axis directions. As the first optical element 100 rotates, the first central axis MCA of the first optical element 100 may also rotate at the same angle. As shown, when the first optical element 100 rotates at a tilt angle TA, the first central axis MCA may rotate at the tilt angle TA relative to the second central axis LCA of the lens 310. The tilt angle TA may have a range of, for example, about 0.1° to about 1°. This case, however, is merely exemplary, and the rotator 110 may drive the first optical element 100 to rotate at any angle as needed in a clockwise direction (or counterclockwise direction) on various planes. In conclusion, the second central axis LCA of the lens 310 may have a slope or angle with respect to the first central axis MCA of the first optical element 100.

The rotation of the first optical element 100 may induce a second shift BS between the input pulse IP and the output pulse OP. The occurrence of the second shift BS due to the rotation of the first optical element 100 caused by adjustment of the tilt angle TA may be substantially the same as the occurrence of the second shift BS due to the movement of the lens 310. For example, the second sub-path P22 of the second pulse MP may be controlled by simultaneously using the rotator 110 to rotate the first optical element 100 and the actuator 330 to move the lens 310.

Figure 8:
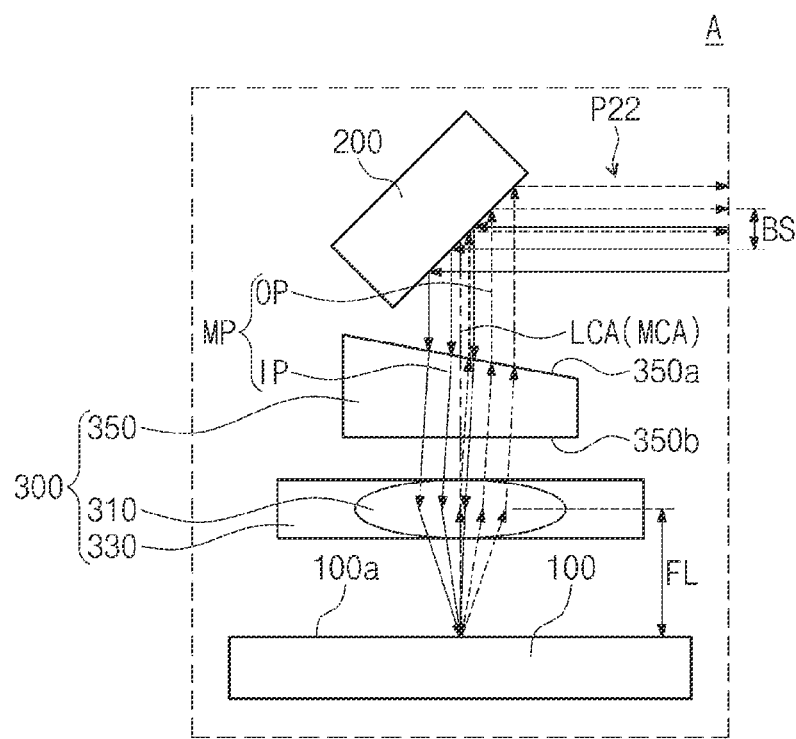

FIG. 8 illustrates a conceptual schematic diagram showing a pulse control optical system in an oscillation unit of a semiconductor manufacturing apparatus according to some example embodiments of the present inventive concepts. For convenience of description, omission may be made to avoid repetitive explanation of components the same or substantially the same as those described with reference to FIG. 6 or 7.

Referring to FIG. 8, the third optical element 300 may include a refraction device 350 between the lens 310 and the second optical element 200. For example, the refraction device 350 may include an actuator that drives the refraction device 350 to move leftward and rightward (e.g., in the Y-axis direction). Differently from that shown, the third optical element 300 may include a plurality of refraction devices 350.

The refraction device 350 may have a top surface 350a and a bottom surface 350b that are not parallel to each other. The top surface 350a and the bottom surface 350b of the refraction device 350 may face the second optical element 200 and the lens 310, respectively. For example, the top surface 350a of the refraction device 350 may have a slope or angle with respect to the top surface 100a of the first optical element 100, and the bottom surface 350b of the refraction device 350 may be parallel to the top surface 100a of the first optical element 100. This, however, is merely exemplary. For example, a reverse relationship may be provided between the top surface 100a of the first optical element 100 and the top and bottom surfaces 350a and 350b of the refraction device 350, and one or both of the top and bottom surfaces 350a and 350b of the refraction device 350 may have a slope or angle with respect to the top surface 100a of the first optical element 100.

The refraction device 350 may refract the input pulse IP that is reflected from the second optical element 200 and then is directed toward the first optical element 100. The refraction device 350 may induce a second shift BS between the input pulse IP and the output pulse OP. The occurrence of the second shift BS due to adjustment of slopes and positions of the top and bottom surfaces 350a and 350b of the refraction device 350 may be substantially the same as the occurrence of the second shift BS due to the movement of the lens 310 and/or the rotation of the first optical element 100. For example, the second sub-path P22 of the second pulse MP may be controlled by simultaneously using the refraction device 350 to refract the input pulse IP and the actuator 330 to move the lens 310.

Figure 9:
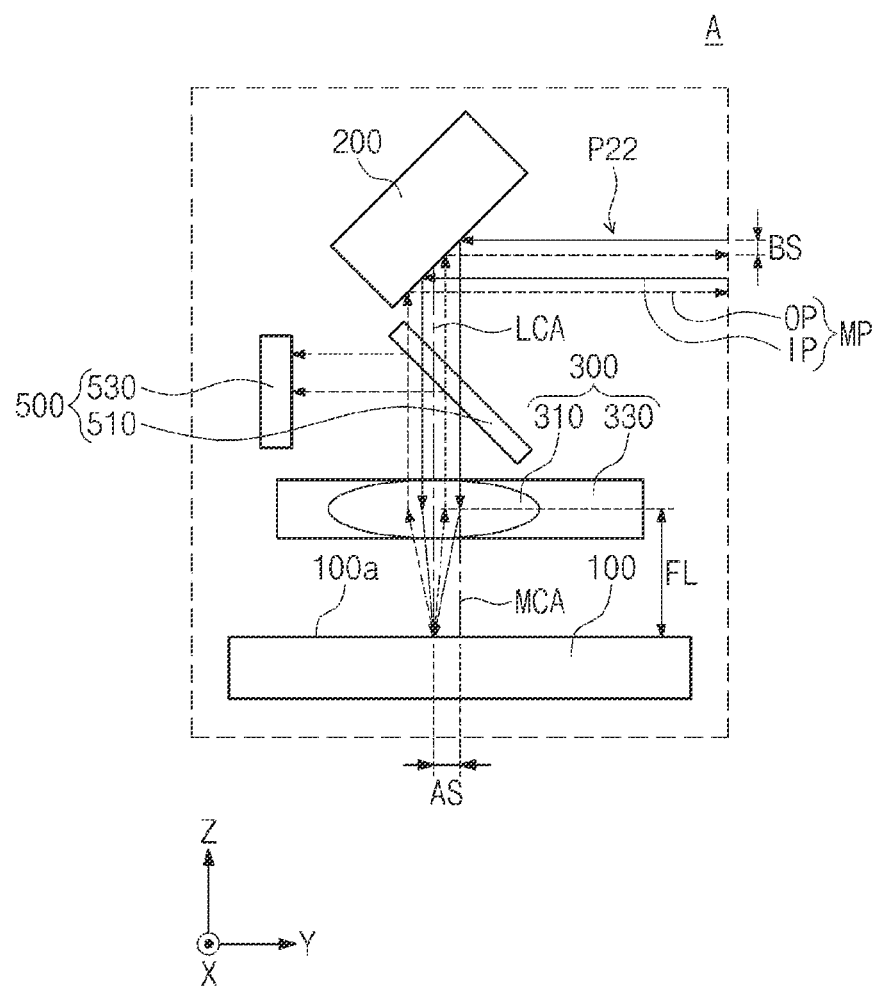

FIG. 9 illustrates a conceptual schematic diagram showing a pulse control optical system in an oscillation unit of a semiconductor manufacturing apparatus according to some example embodiments of the present inventive concepts. For convenience of description, omission may be made to avoid repetitive explanation of components the same or substantially the same as those described with reference to FIG. 6, 7, or 8.

Referring to FIG. 9, the pulse control optical system A may further include a monitoring element or monitoring system 500 between the second optical element 200 and the third optical element 300. For example, the monitoring element 500 may have an interferometer structure including a beam splitter 510 and a sensing mirror 530. The beam splitter 510 may be provided on the second sub-path P22. The beam splitter 510 and the lens 310 may overlap in the Z-axis direction. The sensing mirror 530 may be spaced apart from the beam splitter 510, the second optical element 200, and the third optical element 300. The sensing mirror 530 may not be provided on the second sub-path P22. The sensing mirror 530 and the lens 310 may not overlap in the Z-axis direction. The sensing mirror 530 may include, for example, a wavefront sensor (WFS).

The monitoring element 500 may monitor positions and angles of the second pulse MP. Therefore, the monitoring element 500 may provide feedback in relation to controlling a drive of the actuator 330 and the rotator (see 110 of FIG. 7) and to determining a structure of the refraction device (see 350 of FIG. 8).

A semiconductor manufacturing apparatus according to some example embodiments of the present inventive concepts may be configured such that a main pulse is controlled by optical elements, such as a lens, provided on a path along which only the main pulse travels.

Moreover, in an operating method of the semiconductor manufacturing apparatus according to some example embodiments of the present inventive concepts, the main pulse may be controlled by a pulse control optical system including the lens, and thus it may be possible to improve stability of pulses and to increase productivity of the semiconductor manufacturing apparatus.

Although the present inventive concepts have been described in connection with some example embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not restrictive. The inventive concepts are defined by the following claims, with equivalents of the claims to be included therein.

What is claimed is:

1. An operating method of a semiconductor manufacturing apparatus, the operating method comprising:
   oscillating a first pulse and a second pulse from an oscillation unit that comprises a first seed laser, a second seed laser, and a seed module;
   controlling the second pulse on a path of the second pulse in the seed module;
   amplifying the first and second pulses through a plurality of amplifiers; and
   colliding the first and second pulses with corresponding targets to generate extreme ultraviolet light from an extreme ultraviolet generation unit,
   wherein controlling the second pulse is performed in a pulse control optical system comprising a lens,
   wherein the path of the second pulse comprises a first sub-path that extends from the second seed laser to the pulse control optical system, a second sub-path in the pulse control optical system, and a third sub-path that extends from the pulse control optical system until the second pulse is output from the seed module,
   wherein at least portions of the first sub-path and the third sub-path overlap the path of the first pulse,
   wherein the pulse control optical system is on the second sub-path that does not overlap the path of the first pulse.

2. The operating method of claim 1, wherein controlling the second pulse includes inducing a shift between an input pulse that is input to the pulse control optical system and an output pulse that is output from the pulse control optical system.

3. The operating method of claim 2, wherein the pulse control optical system further comprises an actuator in contact with at least a portion of the lens,
   wherein the shift is induced due to movement of the lens driven by the actuator.

4. The operating method of claim 2, wherein the pulse control optical system further comprises a mirror that is vertically aligned with the lens,
   wherein the shift is induced due to rotation of the mirror.

5. The operating method of claim 1, wherein the pulse control optical system further comprises a monitoring element having an interferometer structure,
   wherein the monitoring element provides feedback to control the second pulse.

6. The operating method of claim 1, wherein controlling the second pulse is performed before amplifying the first and second pulses.

7. The operating method of claim 1, wherein the semiconductor manufacturing apparatus further comprises an amplification unit between the oscillation unit and the extreme ultraviolet generation unit,
   wherein the amplification unit is configured to receive the first pulse and the output pulse of the second pulse.

8. An operating method of a semiconductor manufacturing apparatus, the operating method comprising:
   oscillating a first pulse and a second pulse from an oscillation unit that comprises a first seed laser, a second seed laser, and a seed module;
   controlling the second pulse in the seed module;
   amplifying the first and second pulses through a plurality of amplifiers; and
   colliding the first and second pulses with corresponding targets to generate extreme ultraviolet light from an extreme ultraviolet generation unit,
   wherein the first pulse travels along a first path,
   wherein the second pulse travels along a second path,
   wherein controlling the second pulse is performed in a pulse control optical system comprising a first optical element, a second optical element, and a third optical element,
   wherein the second path comprises a first sub-path that extends from the second seed laser to the pulse control optical system, a second sub-path in the pulse control optical system, and a third sub-path that extends from the pulse control optical system until the second pulse is output from the seed module,
   wherein at least portions of the first sub-path and the third sub-path overlap the path of the first pulse,
   wherein the pulse control optical system is on the second sub-path that does not overlap the path of the first pulse.

9. The operating method of claim 8, wherein the third optical element further comprises an actuator configured to control a position of a lens.

10. The operating method of claim 8, wherein the first optical element and the second optical element are configured to reflect the second pulse.

11. The operating method of claim 8, wherein the third optical element comprises a lens between the first optical element and the second optical element.

12. The operating method of claim 11, wherein a focal length of the lens is the same as a spacing distance between the lens and the first optical element.

* * * * *